US009160265B2

(12) United States Patent
Busch

(10) Patent No.: US 9,160,265 B2
(45) Date of Patent: Oct. 13, 2015

(54) REGULATING CIRCUIT AND METHOD FOR REGULATING ROTARY SPEED, DATA PROCESSING DEVICE, AND PROGRAM CODE

(75) Inventor: Peter Busch, Augsburg (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 91 days.

(21) Appl. No.: 13/881,505

(22) PCT Filed: Oct. 20, 2011

(86) PCT No.: PCT/EP2011/068373
§ 371 (c)(1),
(2), (4) Date: May 15, 2013

(87) PCT Pub. No.: WO2012/055768
PCT Pub. Date: May 3, 2012

(65) Prior Publication Data
US 2013/0229140 A1    Sep. 5, 2013

(30) Foreign Application Priority Data
Oct. 27, 2010  (DE) .......................... 10 2010 049 856

(51) Int. Cl.
*H02P 23/00*  (2006.01)
*H02P 3/00*  (2006.01)
(Continued)

(52) U.S. Cl.
CPC .. *H02P 7/06* (2013.01); *G06F 1/20* (2013.01); *G06F 1/206* (2013.01); *H05K 7/20209* (2013.01)

(58) Field of Classification Search
CPC . H02M 7/527; H02M 7/529; H02M 7/53873; H02M 7/53875; H03K 3/017; H05K 7/20; H02P 27/08; H02P 23/0077; H02P 6/085
USPC .................................................. 318/473, 811
See application file for complete search history.

(56) References Cited

U.S. PATENT DOCUMENTS 4,278,924 A * 7/1981 Mawatari et al. ............. 388/814
4,506,312 A * 3/1985 Chan et al. .................... 361/240
(Continued)

FOREIGN PATENT DOCUMENTS

DE     10 2004 002 447 A1    8/2005
JP     7-239165    9/1995
(Continued)

OTHER PUBLICATIONS

English translation of Japanese Office Action dated Mar. 31, 2015 of corresponding Japanese Application No. 2013-535376.

*Primary Examiner* — Eduardo Colon Santana
*Assistant Examiner* — Gabriel Agared
(74) *Attorney, Agent, or Firm* — DLA Piper LLP (US)

(57) ABSTRACT

A regulating circuit that regulates rotary speed of a pulse-width modulated fan includes a measuring device that determines a period duration ($T_{Ist}$) of a tacho signal (TACH) of the fan, a digital regulating register that acquires a regulation value to drive the fan on the basis of a determined period duration ($T_{Ist}$) and a desired value ($T_{soll}$), a digital control register that adjusts a duty ratio to drive the fan, the digital control register has a smaller register width than the digital regulating register, and a controller that updates the digital control register by evaluating a predetermined number of more significant bits of the digital regulating register.

14 Claims, 4 Drawing Sheets

(51) Int. Cl.
*H02P 7/06* (2006.01)
*G06F 1/20* (2006.01)
*H05K 7/20* (2006.01)

(56) References Cited

U.S. PATENT DOCUMENTS

| | | | | |
|---|---|---|---|---|
| 6,496,340 | B1* | 12/2002 | Hornberger et al. | 361/51 |
| 6,545,438 | B1* | 4/2003 | Mays, II | 318/400.01 |
| 6,597,205 | B2* | 7/2003 | Powell et al. | 327/48 |
| 6,874,327 | B1* | 4/2005 | Wahler et al. | 62/178 |
| 7,092,623 | B2* | 8/2006 | Bekker | 318/400.37 |
| 7,664,933 | B2* | 2/2010 | Kamiya et al. | 712/209 |
| 2003/0193307 | A1* | 10/2003 | Burstein | 318/473 |
| 2004/0234376 | A1* | 11/2004 | Marando et al. | 417/44.1 |
| 2004/0257024 | A1* | 12/2004 | Marando et al. | 318/647 |
| 2005/0256670 | A1* | 11/2005 | Bekker et al. | 702/145 |
| 2006/0095559 | A1* | 5/2006 | Mangan et al. | 709/224 |
| 2006/0164229 | A1* | 7/2006 | Masters et al. | 340/461 |
| 2006/0181232 | A1* | 8/2006 | Oljaca et al. | 318/268 |
| 2006/0282715 | A1* | 12/2006 | Moll et al. | 714/701 |
| 2007/0124574 | A1* | 5/2007 | Goldberg | 713/100 |
| 2008/0013929 | A1* | 1/2008 | Lee | 388/811 |
| 2010/0134168 | A1* | 6/2010 | Kris | 327/175 |
| 2013/0229140 | A1* | 9/2013 | Busch | 318/811 |

FOREIGN PATENT DOCUMENTS

| | | |
|---|---|---|
| JP | 7-274578 | 10/1995 |
| JP | 2004-205095 | 7/2004 |

* cited by examiner

PRIOR ART

PRIOR ART

REGULATING CIRCUIT AND METHOD FOR REGULATING ROTARY SPEED, DATA PROCESSING DEVICE, AND PROGRAM CODE

TECHNICAL FIELD

This disclosure relates to a regulating circuit that regulates the rotary speed of a pulse-width-modulated fan, having a digital control register that adjusts a duty ratio to drive the fan. The disclosure also relates to a data processing device comprising such a regulating circuit and to a method and program code that regulates the rotary speed of a pulse-width-modulated fan.

BACKGROUND

Regulating circuits that regulate the rotary speed of pulse-width-modulated fans are known. For example, DE 102004002447 B4 discloses a regulating circuit with over-temperature signaling. In that case, the fan regulating circuit contains an input that supplies a temperature-dependent control signal to provide a desired value for the rotary speed of the fan. When a first temperature threshold is reached, an over-temperature warning is signaled by inverting a signal at a first signal output which indicates the current rotary speed of the fan. This and other regulating circuits are particularly suitable to regulate electronically commutated fans which, on account of their connection diagram, are often also referred to as four-wire fans.

FIG. 1 illustrates an exemplary arrangement comprising a pulse-width-modulated fan 1, a regulating circuit 2 and a component 3 to be cooled. Arranged in the region of the component 3 is a temperature sensor 4 which can be used to detect the temperature of the component 3 to be cooled to predefine a regulation value for the regulating circuit 2. In the arrangement illustrated in FIG. 1, the components 2, 3 and 4 are arranged on a common printed circuit board 5 of a data processing device, for example, a computer system or a network component.

Conventional regulation of the fan 1 is described below using FIG. 2. The pulse-width-modulated fan 1 generates a tacho signal TACH, the tacho signal containing, for example, one or two tacho pulses per revolution of the fan wheel. This tacho signal is supplied to a frequency measuring device 6. The frequency measuring device 6 also receives a control signal from a timer device 7. The timer device 7 comprises, for example, a digital oscillator and a control logic unit to determine a window length to measure a frequency by the frequency measuring device 6.

The frequency measuring device 6 determines the number of tacho pulses in the tacho signal TACH which are detected in a time window determined by the timer device 7. For example, the frequency measuring device 6 can determine how many tacho pulses occur in one second. A rotary speed comparator 10 then compares this value $N_{Ist}$ with a predefined desired value $N_{Soll}$ determined, for example, on the basis of a measured temperature θ.

The difference between the desired number of tacho pulses $N_{Soll}$ and the actual number of tacho pulses $N_{Ist}$ is transmitted to a pulse-width control device 8 as a value ΔN. The difference value ΔN is then used to predefine a duty ratio as a digital value P to drive the fan 1 for a pulse-width modulation device 9 by a function $p_1(\Delta N)$. The function $p_1$ may be predefined, for example, in the form of a table containing control values P for particular difference values ΔN. A free-running counter of the pulse-width modulation device 9 is then readjusted to the desired duty ratio on the basis of the value P. The pulse-width modulation device 9 generates a pulse-width-modulated signal PWM therefrom and makes the signal available to the fan 1 via a drive line.

Detecting tacho pulses inside a limited measuring time window of one second, for example, reduces the accuracy with which the rotary speed is detected. A rotary speed of 800 revolutions per minute, for example, and two tacho pulses per revolution result in a counter reading of 26 after one second, for example, while the mathematically correct value is 26.67. In the previously described case, an error of approximately 2.5% thus already occurs when detecting the rotary speed.

The measurement could be improved, for example, by extending the time window, but the regulating speed of the regulating circuit 2 would then decrease. Furthermore, particular regulating parameters would additionally have to be complied with to prevent escalation of the fan rotary speed.

As described above, a free-running counter of the pulse-width modulation device 9 is then adjusted to the desired duty ratio on the basis of the determined number $N_{Ist}$ of determined tacho pulses. Inexpensive counters of this type have a resolution of eight bits, with the result that a resolution of 0-100% of the duty ratio would be theoretically possible in 255 steps. However, since a sensibly usable frequency of the PWM drive signal for the fan 1 is often predefined within narrow limits, for example, 20-25 kHz, but an oscillator clock of the counter can generally only be divided down into steps of two and/or four, the uppermost possible control value of the pulse-width control device 8 must be limited to a value of lower than 255 to obtain the correct drive frequency. If this is effected to a value of 100, for example, a fan 1 having a maximum rotary speed of 5,000 revolutions per minute already only has a drive resolution of 50 revolutions per minute, depending on the usable bit of the control register. The increase or decrease in a rotary speed of 50 revolutions per minute is already clearly audible. Such audible changes in the operating noise of the fan 1 are often perceived as disruptive by a user of a data processing device.

The driving could be improved, for example, by a higher-quality pulse-width modulation device 9 having a counter with a higher resolution. However, this results in cost disadvantages since the counters present in integrated regulating circuits can then no longer be used.

It could therefore be helpful to describe an improved regulating circuit and a method of regulating the rotary speed of a pulse-width-modulated fan, which method improves the regulating accuracy. In this case, the method is intended to be able to be implemented as easily as possible using hardware or software.

SUMMARY

I provide a regulating circuit that regulates rotary speed of a pulse-width-modulated fan including a measuring device that determines a period duration ($T_{Ist}$) of a tacho signal (TACH) of the fan, a digital regulating register that acquires a regulation value to drive the fan on the basis of a determined period duration ($T_{Ist}$) and a desired value ($T_{Soll}$), a digital control register that adjusts a duty ratio to drive the fan, the digital control register having a smaller register width than the digital regulating register, and a controller that updates the digital control register by evaluating a predetermined number of more significant bits of the digital regulating register.

I also provide a data processing device including at least one component to be cooled, at least one pulse-width-modulated fan that cools the component to be cooled, having at least one first connection that provides a pulse-width-modulated control signal (PWM) to control the fan rotary speed and at least one second connection that detects a tacho signal (TACH), and at least one regulating circuit having a pulse-width control device including the control register, the measuring device being connected to the second connection (TACH) and the pulse-width control device being electrically connected to the first connection.

I further provide a method of regulating rotary speed of a pulse-width-modulated fan including determining a period duration ($T_{Ist}$) of a tacho signal (TACH) of the fan, updating a regulation value (R) that drives the fan on a basis of the determined period duration ($T_{Ist}$) and a desired value ($T_{Soll}$), the regulation value (R) including a more significant portion and a less significant portion, and at least the less significant portion being updated during each update, and determining a duty ratio to drive the fan on the basis of the more significant portion of the determined regulation value (R).

I further yet provide a program code having processor instructions for a microcontroller, the method of regulating rotary speed of a pulse-width-modulated fan being carried out during execution of the processor instructions by the microcontroller.

LIST OF REFERENCE SYMBOLS

Figure 1:
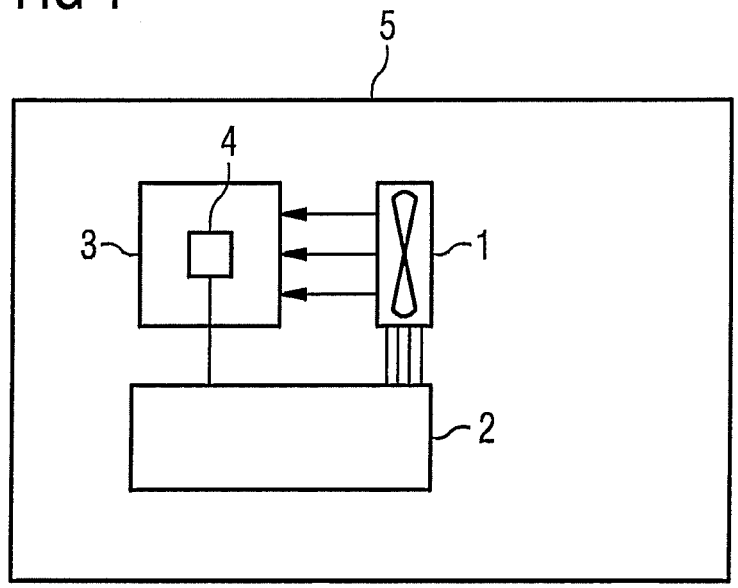
FIG. 1 shows a data processing device having a regulating circuit.
Figure 2:
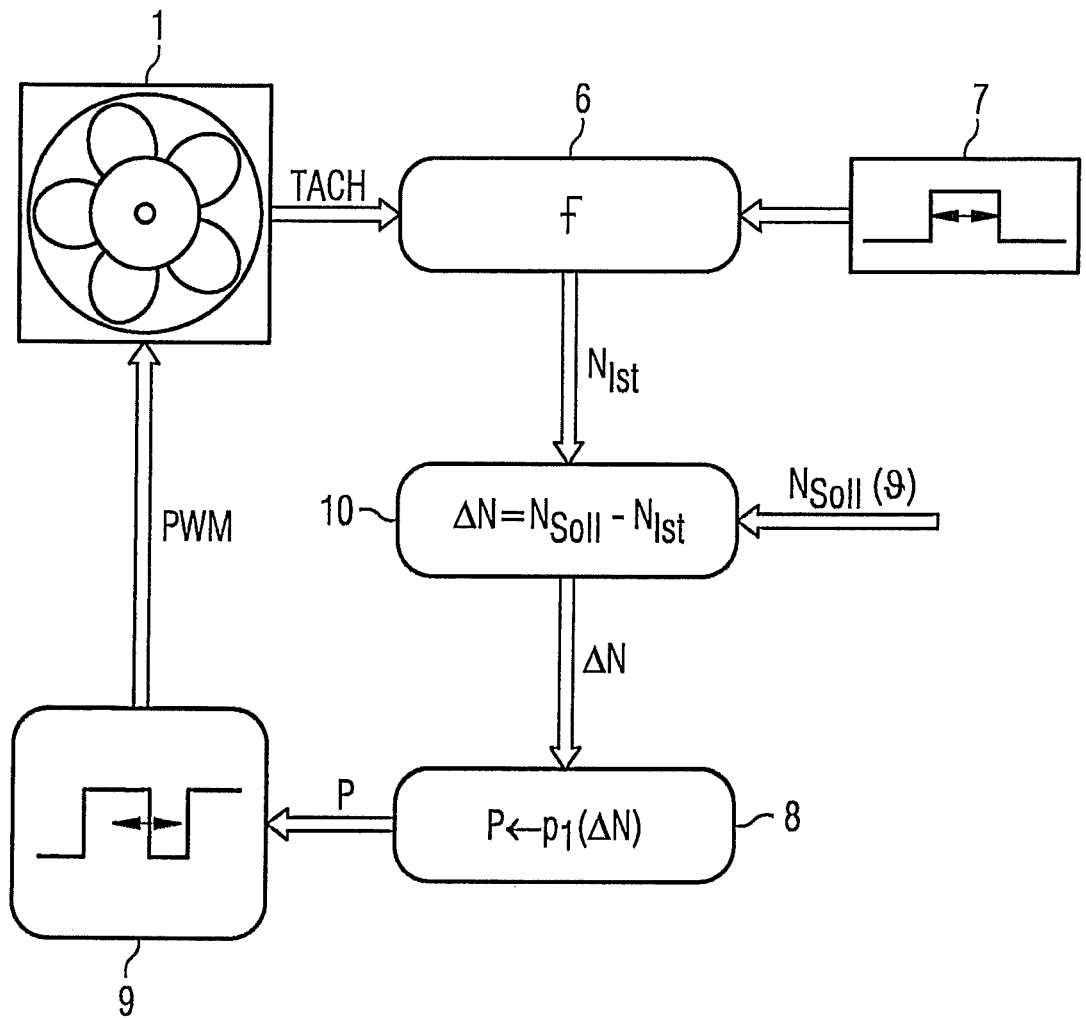
FIG. 2 shows a schematic illustration of a convention regulating method.

1 Pulse-width-modulated fan
2 Regulating circuit
3 Component to be cooled
4 Temperature sensor
5 Printed circuit board
6 Frequency measuring device
7 Time device
8 Pulse-width control device
9 Pulse-width modulation device
10 Rotary speed comparator
11 Digital counter
12 Edge detector
13 Control unit
14 Measuring device
15 Counter register
16 Temperature regulation
17 Subtractor
18 Regulating register
19 Adder
20 Shifting device
21 Control register

DETAILED DESCRIPTION

We provide a regulating circuit that regulates the rotary speed of a pulse-width-modulated fan, comprising a measuring device that determines a period duration of a tacho signal of the fan. The regulating circuit also comprises a digital regulating register that acquires a regulation value to drive the fan on the basis of a determined period duration and a desired value, and a digital control register that adjusts a duty ratio to drive the fan. In this case, the digital control register has a smaller register width than the digital regulating register. The regulating circuit also comprises control means/a controller set up to update the digital control register by evaluating a predetermined number of more significant bits of the digital regulating register.

Interaction of a measuring device that determines a period duration of a tacho signal in conjunction with a digital regulating register that acquires a regulation value makes it possible to improve the control accuracy of the regulating circuit with little effort. In particular, the described regulating circuit allows very accurate detection of the tacho signal for individual period durations of a fan revolution. On the basis of this accurate value, the digital regulating register can then be updated, the regulating register being used simultaneously as a memory for duty ratio values and as a regulator. As a result of the fact that the control means then use only a predetermined number of more significant bits to update the actual control register, the regulating accuracy of the regulating circuit is effectively increased without requiring a more complicated pulse-width control device.

The regulating circuit is characterized in that the digital control register may have a register width of m bits and the digital regulating register may have a register width of n bits. In this case, the control means are set up to update the digital control register by shifting the content of the regulating register bit by a bit width of n-m bits. Shifting the content of the regulating register bit by bit to update the control register makes it possible to update the control register in a particularly simple and effective manner.

The regulating circuit is characterized in that the measuring device may comprise a digital counter, the counter reading of which is changed by a predetermined value with each clock signal from an oscillator, the period duration being determined on the basis of a difference between a first counter reading upon the reception of a first tacho pulse and a second counter reading upon the reception of a second tacho pulse. Such a measuring device can be implemented in a very simple manner. For example, an oscillator which is present anyway can be used to determine the period duration of the tacho signal in a very accurate manner with the aid of a simple counter.

The regulating circuit is characterized in that an overflow register that stores a number of overflows of the digital counter between the first tacho pulse and the second tacho pulse may be provided. In this case, the measuring device is also set up to take into account the number of overflows stored in the overflow register when determining the period duration. Taking into account overflows also makes it possible to use relatively simple counters with a short register width to detect relatively long period durations.

The regulating circuit is characterized by monitoring means/devices that monitor the overflow register, the measuring device being set up to determine a period duration independently of the reception of the second tacho pulse upon reaching a predetermined number of overflows and to output the period duration for processing by the digital regulating register. Such monitoring means make it possible to maintain the function of the regulating circuit even if the fan is completely blocked. In particular, the regulating register is updated at least once each time the predetermined number of overflows is reached.

The regulating circuit may be characterized by subtracting means to determine a difference between a digital actual value, which is provided by the measuring device and corresponds to the determined period duration of the tacho signal, and the desired value, the control means being set up to correct the content of the regulating register with the correct sign by the difference determined by the subtracting means. Providing a comparison means and updating the regulating register with the correct sign make it possible to easily track the content of the regulating register.

The described regulating circuit is suitable, for example, for use in a data processing device comprising at least one component to be cooled and at least one pulse-width-modulated fan that cools the component to be cooled, having at least one first connection that provides a pulse-width-modulated control signal to control the fan rotary speed and at least one second connection that detects a tacho signal.

Preferably, the data processing device also comprises at least one temperature sensor and an evaluation means, the evaluation means being set up to provide a desired value for the regulating circuit on the basis of a temperature detected by the temperature sensor.

We also provide a method of regulating the rotary speed of a pulse-width-modulated fan, having the following steps of:
determining a period duration of a tacho signal of the fan,
updating a regulation value to drive the fan on the basis of the determined period duration and a desired value, the regulation value comprising a more significant portion and a less significant portion, and at least the less significant portion being updated during the update, and
determining a duty ratio to drive the fan on the basis of the more significant portion of the determined regulation value.

Updating the regulation value on the basis of a determined period duration makes it possible to determine a relatively accurate regulation value for each individual determined period duration of the tacho signal. On the basis thereof, a duty ratio to drive the fan can be determined with a lower degree of accuracy on the basis of the more significant portion of the regulation value.

The steps of determining the period duration, updating the regulation value and determining the duty ratio may be carried out at least once per revolution of a fan wheel of the fan and/or once per tacho pulse of the tacho signal. Frequently carrying out the abovementioned steps makes it possible to increase the regulating speed of the method while simultaneously increasing the regulating accuracy.

The described method is suitable, for example, for implementation using program code having processor instructions for a microcontroller, the abovementioned steps being carried out during execution of the processor instructions by the microcontroller.

My circuits, methods, data processing devices and program code are explained in more detail below using different examples with reference to the figures.

Figure 3:
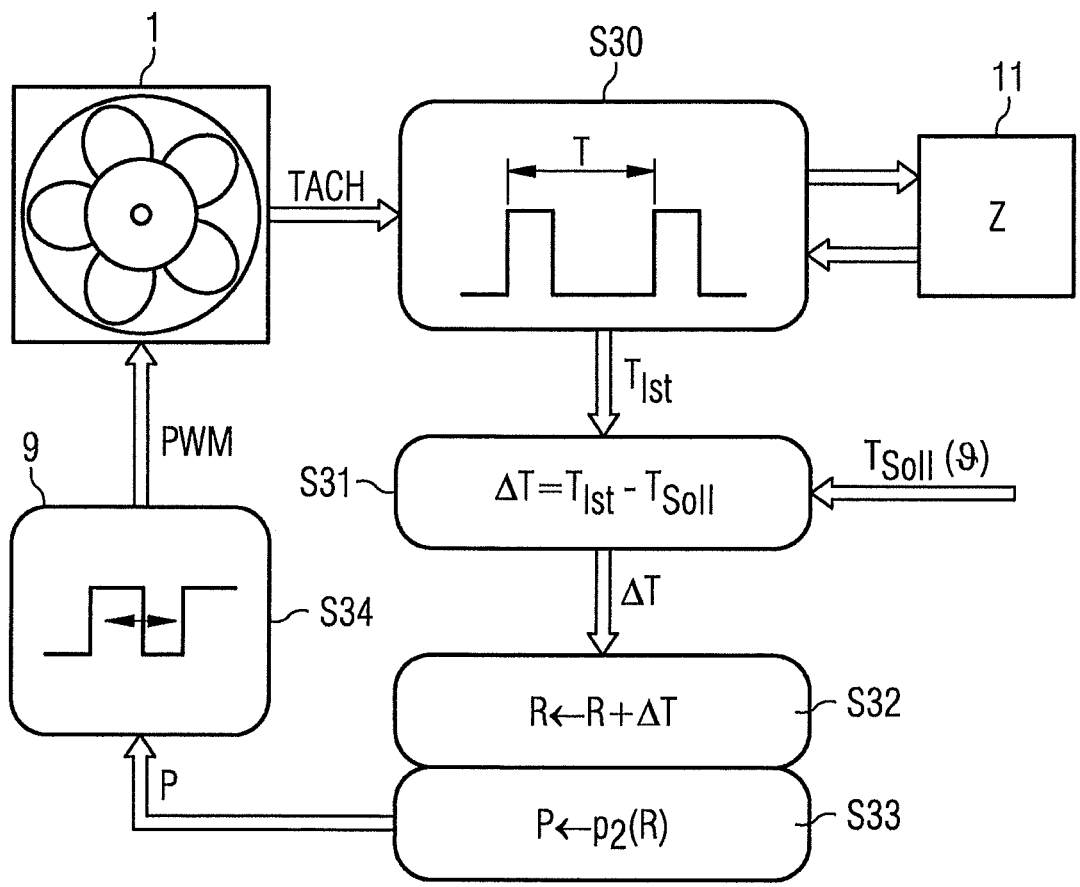
FIG. 3 shows a schematic illustration of one example of my regulating method.

FIG. 3 shows a schematic illustration of a method of regulating the rotary speed of a pulse-width-modulated fan 1.

A first step S30 determines the period duration $T_{Ist}$ of a tacho signal TACH of the fan 1. Rising and falling edges of tacho pulses of the fan 1, for example, may be determined for this purpose. It goes without saying that it is also possible to determine the difference between successive rising or falling edges of the tacho signal TACH. A digital counter 11 is used in step S30 to determine the period duration $T_{Ist}$ according to one example. The accurate driving of the digital counter 11 is explained in detail later with reference to the regulating circuit 2 according to FIG. 4.

The period duration $T_{Ist}$ determined in step S30 is compared with a predefined desired value $T_{Soll}$ in a step S31. In particular, the difference ΔT between the measured period duration $T_{Ist}$ and a temperature-dependent desired value $T_{Soll}$ is determined.

The resulting difference ΔT is added to the value R of a regulating register with the correct sign in a subsequent step S32. The content R of the regulating register is thereby corrected for each determined period duration $T_{Ist}$.

In a subsequent step S33, a control value P for a control register of a pulse-width control device 8 is determined on the basis of the content R of the regulating register using a function $p_2(R)$. In the example, the control value P is determined by shifting the content R of the regulating register to the right by a predetermined number of bit positions. It goes without saying that other functions, for example, an integer division of the regulation value R without determining the remainder, can also be used. In comparison with known functions $p_1$ that regulate the frequency, these functions can be implemented in a considerably easier manner as a circuit or a microcontroller program.

In a step S34, a pulse-width modulation device 9 then generates a pulse-width-modulated control signal PWM on the basis of the control value P. This signal is used directly to drive the pulse-width-modulated fan 1, thus producing a closed control loop.

The described method is equally suitable for implementation by program code of a microcontroller and for implementation using hardware. An example of hardware regulating circuit 2 is described below with reference to FIG. 4.

In the example illustrated there, the tacho signal TACH of a four-wire fan 1 is supplied to a measuring device 14. The measuring device 14 comprises an edge detector 12 supplied with the tacho signal TACH. For each rising edge of the tacho signal TACH, the edge detector 12 generates a control pulse and forwards the latter to a control unit 13 of a measuring device 14. The measuring device 14 also comprises a digital counter 11 having a counter register 15 with a width of j bits. For each rising edge of an external clock signal CLK, the counter register 15 is increased by the value 1.

The control unit 13 is set up to store the current value of the counter register 15 in a buffer Z(a) upon the reception of a first control signal from the edge detector 12. In the case of a subsequent control signal from the edge detector 12, that is to say in the case of the next tacho pulse of the tacho signal TACH, the then current counter reading Z of the counter register 15 is recorded in a further variable Z(n). At this time, the difference between the new counter reading Z(n) and the old counter reading Z(a) is determined. The value of the new counter reading Z(n) is then transferred to the storage position for the old counter reading Z(a).

To make it possible to accurately detect the period duration even when the counter register 15 overflows, the number of overflows of the counter register 15 is recorded in a further variable Ü. For this purpose, a further control signal is transmitted from the digital counter 11 to the control unit 13 for each overflow. The digital counter 11 then begins again with a counter reading Z of 0 in the counter register 15. The calculation corrected by the overflow in the case of a free-running counter 11 is carried out in the example by virtue of the variable Ü being converted into a 16-bit variable $Ü_{16}$ by being shifted to the left eight times for each newly detected tacho pulse edge and by virtue of the output value of the measuring device 14 then being determined by calculating $T_{Ist} = Ü_{16} + Z(n) - Z(a)$ and being stored. After the output value $T_{Ist}$ has been calculated, the variable Ü is reset to 0.

Advantageously, the function of the fan may also be monitored by monitoring the number of overflows. If no new tacho pulse is detected by the edge detector 12 up to a previously defined maximum value of the variable U, for example, four overflows, the fan 1 is either blocked or is running much too slowly to maintain cooling. In this case, upon reaching the predetermined overflow value, the value $T_{Ist}$ is determined, as described above, to make this value available as soon as possible for further processing by the downstream circuit. The counter reading Z of the free-running counter is then read out, despite the missing tacho pulse, and stored as the variable Z(a), and the variable Ü is reset to 0. The next tacho pulse is then awaited and all variable values are reset, as described above, to prepare the measurement for the subsequent tacho pulse after next, as described above.

The advantage of the above-described way of determining the period duration $T_{Ist}$ is not only that a digital counter 11 which is present anyway, for example, of a microcontroller, can be used, but also that this way of determining the period duration does not result in any "half bits," that is to say incomplete counting intervals of the clock signal CLK between adjacent tacho pulses, being lost. This is because the remainder of the clock interval contributes to the result for the next measurement of the period duration of the tacho signal TACH.

Alternatively, in particular, if a microcontroller having an interrupt-controlled free counter is available, the period duration $T_{Ist}$ can also be determined as follows. In the case of a first tacho pulse, a counter reading Z of a counting register 15 is reset to 0 and started with the aid of an interrupt, for example. With each new tacho pulse, the then current counter reading Z of the digital counter 11 is then read out, for example, with the aid of a further interrupt, and is stored as a variable $T_{Ist}$ in an eight-bit register, for example. The digital counter 11 is then immediately reset to 0 again and restarted.

If such a digital counter 11 overflows and then begins with 0 again before a new tacho pulse is detected by the edge detector 12, there are two possible procedures. The number of overflows for the period measurement must either be concomitantly counted by incrementing a variable Ü, as described above, and must then be taken into account when outputting the period duration $T_{Ist}$. A maximum value for the variable U should also be stipulated in this case. After the maximum value has been reached, a predetermined maximum period duration $T_{Ist}$ should be output, the digital counter 11 should be reset and the digital counter 11 should be restarted.

If a delayed tacho pulse arrives before the digital counter 11 overflows again, a then incorrect value $T_{Ist}$ for the fan period is optionally not output, rather the counter is restarted with a value of 0 so that it is ensured that an initial value for the period duration $T_{Ist}$ is always generated, either a correct value or, if the fan is blocked, a time-limited value. A control bit can be set for this purpose in a further register, which control bit indicates that the maximum value has been reached and can simultaneously be evaluated as an alarm signal. In contrast, if the maximum value has been selected to be very large in comparison with a normal period duration of a functional fan 1, a period duration which is incorrectly determined to be too short can alternatively also be forwarded and has only a slight influence on the fan regulation in comparison with the very large correction caused by the maximum value.

Alternatively, the overflow signal of the digital counter 11 can also be used as the limit of the maximum tacho period detected. In this case, the maximum value of the digital counter 11 is output as the maximum period duration $T_{Ist}$ if the digital counter 11 is reset to 0 and immediately restarted. In this case too, the content of the counter register 15 then may not be output when a delayed tacho pulse occurs, but rather the digital counter 11 can be reset to 0 only by a suitable reset signal and started.

To determine the system deviation of the determined period duration $T_{Ist}$, a desired value $T_{Soll}$ is predefined in a desired value register. The value $T_{Soll}$ can either be permanently predefined or can be variably predefined by a temperature measurement or another reference variable. This value will change only slowly in comparison with the fan period $T_{Ist}$ with respect to the fan frequency during normal operation of the regulating circuit 2. If there are a plurality of reference variables, for example, a temperature measurement and an external adjustment of the intended fan rotary speed, these values should already be taken into account in the common value $T_{Soll}$ of the temperature control 16.

Figure 4:
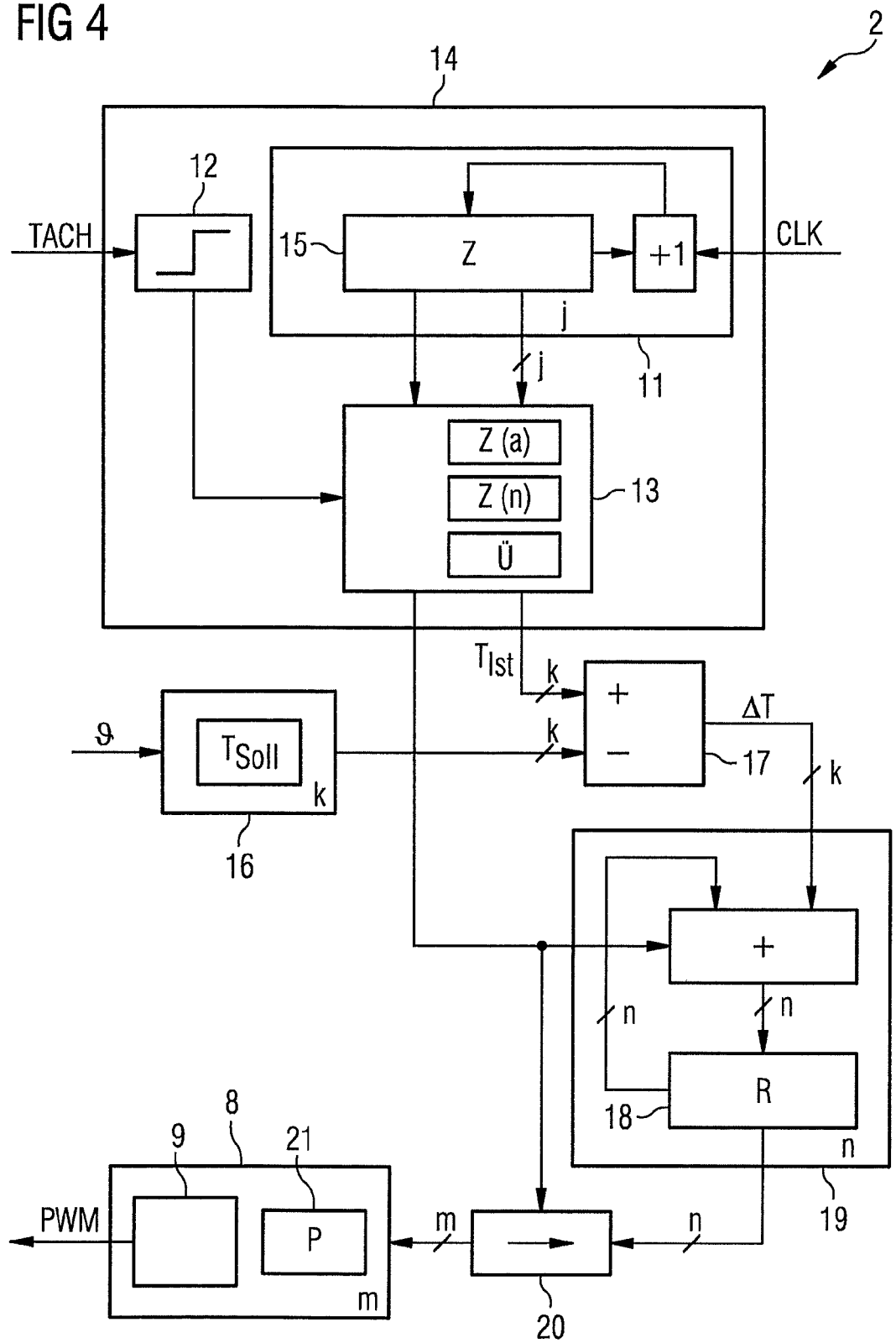
FIG. 4 shows a schematic illustration of one example of my regulating circuit.

In the example illustrated in FIG. 4, the desired value $T_{Soll}$ is predefined as a digital desired value by a temperature regulation means 16 which is not illustrated in detail. For example, a fan characteristic curve for different temperatures θ of a data processing device may be stored in the temperature regulation means 16.

The predefined digital desired value $T_{Soll}$ is subtracted from the actual value $T_{Ist}$ of the period duration of the tacho signal TACH, as determined by the measuring device 14, by a subtractor 17. In the example, the subtractor is a digital subtractor 17 which subtracts two digital values from one another with a predetermined precision, 16 bits in the example. The result is stored, for example, as the variable ΔT with a sign. The value is positive if the fan 1 runs too slowly and is negative if the fan 1 runs too quickly.

The difference ΔT output by the subtractor 17 is then added to the content R of a regulating register 18 of an adder 19. In this case, the regulating register 18 should at least have a range of values which is as large as, preferably even larger than, the individual values used to determine it. For example, the regulating register 18 may have a width of 16 bits. As soon as there is a new value ΔT, it is added, with the correct sign, to the content R of the regulating register 18 and is again stored in the regulating register 18 of the adder 19.

Alternatively, the regulation value R can be completely updated by the adder 19, that is to say without using a separate subtractor 17. In this case, the actual value $T_{Ist}$ and the desired value $T_{Soll}$ are each directly added to the regulation value R or subtracted from the latter. In this case, it should be ensured that the regulating register 18 has a sufficient register width to avoid overflows or underflows.

To increase the operational reliability, the content R of the regulating register 18 can have a lower and/or upper limit using maximum values, for example, 0 and 65 536. This makes it possible to avoid overflows of the content of the regulating register 18. The content R of the regulating register 18 thereby assumes solely positive values. In this case, the starting value of the regulating register 18 when the fan 1 is started determines a starting value for the downstream control circuit for the pulse width modulation of the fan 1.

To be able to accelerate stabilization of the regulating circuit 2 at a low fan rotary speed 1, a check can be carried out, before adding the difference ΔT, to determine whether this value is positive and possibly exceeds a predetermined limit. If this is the case, the value can be doubled or quadrupled by being shifted to the left by one or two bits and can only then be added to the content R of the regulating register 18. This increases the readjustment speed of the regulating circuit 2 to increase the rotary speed of the fan 1, but not to reduce the rotary speed. The control loop remains stable as a result, but starts more quickly when the fan 1 is started.

Depending on the regulating register 18, a control value P for a pulse-width control device 8 is now determined. For this purpose, the regulation value R of the regulating register 18 is shifted to the right by so many bits, for example, until the most significant bits of the regulation value R represent the bits of a digital value P with a lower resolution of eight bits, for example, and is loaded into a control register 21 of the pulse-width control device 8. For example, this may be carried out by a shifting device 20. Alternatively, only parts of the regulating register 18 may also be connected to the control register 21, for example, in the case of a two-part regulating register 18 having a more significant subregister and a less significant subregister. As a result, a pulse-width control device 8 with an integrated counter having an accuracy of eight bits can be used.

If the desire is not to allow an integrated counter of the pulse-width control device 8 to run at a frequency derived directly from the clock oscillator and a register bit length, it is possible to allow the counter to overflow at a lower value, rather than at a maximum length of the timer, for example, at a value of 197 instead of 255 in the case of an eight-bit counter. This results in a different repetition frequency. In this case, either the maximum value of the control register 21 or the maximum value of the regulating register 18 should be adapted to this lower value, as described above.

The control loop is finally closed by virtue of a pulse-width modulation device 9 producing a pulse-width-modulated control signal PWM for the fan 1. There is then no longer any need for a separate functional unit to calculate the control signal PWM.

The regulating register 18 described above or a corresponding variable with a regulation value R to drive the fan 1 simultaneously operates as a memory for the duty ratio values and as a regulator. Each time a tacho pulse is detected, a positive or negative amount is added, with the correct sign, to the least significant bits of the register 18. As a result, one of the more significant bits of the register 18 generally also does not immediately change. Only when the addition results in a change in the more significant bits does the duty ratio of the pulse-width modulation device 8, as predefined by the control value P, also change. This has the advantage, inter alia, that asymmetrical tacho pulses are compensated for, for example, when outputting a pulse when a fan wheel is rotated through 0° and when outputting a further pulse in the case of a rotation of 190° instead of the correctly transmitted tacho pulses at 0° and 180° when determining the period duration $T_{Ist}$ of the subsequent pulse, and are averaged out by the regulating register 18. Therefore, they do not interfere with the readjustment of the fan 1. In this case, the maximum value or the bit length n of the regulating register 18 in comparison with the length m of the control register 21 determines the speed and also the stability of the regulating process. If the regulating register 18 is eight bits longer than the maximum desired value deviation $\Delta T$, the regulating process will be slower but also more stable than in the case of a difference of only six bits.

Upon closer consideration, it is determined that the duty ratio of the pulse-width modulation device 8 is updated more frequently than in known regulating circuits. This is partially effected each time a tacho pulse is detected, that is to say during each half revolution of the fan 1, for example. In this case, the value of the regulating register 21 can dynamically change back and forth between two adjacent values, which clearly corresponds to half a bit of the timer of the modulation device 9. If the duty ratio predefined in this manner remains constant over a plurality of tacho pulses, its value P briefly increases or decreases and immediately changes back again. This means that the duty ratio effectively applied to the fan 1 in the medium term can assume intermediate values of, for example, half a bit, a third of a bit or a quarter of a bit. This regulation is therefore not restricted to the digital resolution of the pulse-width modulation device 9 or of the control register 21. Instead, such intermediate values are mechanically averaged by the fan 1, such averaging not being perceptible to a user.

The invention claimed is:

1. A regulating circuit that regulates rotary speed of a pulse-width-modulated fan comprising:
    a measuring device that determines a period duration ($T_{Ist}$) of a tacho signal (TACH) of the fan,
    a digital regulating register that acquires a regulation value to drive the fan on the basis of a determined period duration ($T_{Ist}$) and a desired value ($T_{soll}$),
    a digital control register that adjusts a duty ratio to drive the fan, the digital control register having a smaller register width than the digital regulating register, and
    a controller that updates the digital control register by evaluating a predetermined number of highest level bits of the digital regulating register relative to lowest level bits of the digital regulating register,
    wherein the digital control register has a register width of m bits and the digital regulating register a has width of n bits, the controller updating the digital control register by shifting content of the digital regulating register by a bit width of n-m bits so that the highest level bits of the regulation value represent the bits of a digital value with a lower resolution of m bits.

2. The regulating circuit according to claim 1, wherein, by a subtracting device that determines a difference ($\Delta T$) between a digital actual value provided by the measuring device and corresponds to the determined period duration ($T_{Ist}$) of the tacho signal, and the desired value ($T_{soll}$), the controller corrects a content of the regulating register with a correct sign by the difference determined by the subtracting means.

3. The regulating circuit according to claim 1, wherein the measuring device comprises a digital counter, the counter reading of which is changed by a predetermined value with each clock signal from an oscillator, the period duration ($T_{Ist}$) of the tacho signal (TACH) being determined on the basis of a difference between a first counter reading upon reception of a first tacho pulse and a second counter reading upon reception of a second tacho pulse.

4. The regulating circuit according to claim 3, wherein the digital counter increments continuously, the first counter reading being buffered upon reception of the first tacho pulse and the difference between the current counter reading and the buffered first counter reading being determined upon reception of the second tacho pulse.

5. The regulating circuit according to claim 3, wherein the digital counter increments continuously, the digital counter being reset to a neutral value upon reception of the first tacho pulse and the current counter reading being determined upon reception of the second tacho pulse.

6. The regulating circuit according to claim 3, wherein, by an overflow register that stores a number of overflows of the digital counter between the first tacho pulse and the second tacho pulse, the measuring device accounts for the number of overflows stored in the overflow register when determining the period duration ($T_{Ist}$).

7. The regulating circuit according to claim 6, wherein, by monitor that monitors the overflow register, the measuring device determines a period duration ($T_{Ist}$) independently of reception of the second tacho pulse upon reaching a predetermined number of overflows and to output said period duration to the digital regulating register for processing.

8. The regulating circuit of claim 1, wherein the digital regulation register acquires the regulation value to drive the fan for each determined period duration.

9. A data processing device comprising:
   at least one component to be cooled,
   at least one pulse-width-modulated fan that cools the component (3) to be cooled, having at least one first connection that provides a pulse-width-modulated control signal (PWM) to control the fan rotary speed and at least one second connection that detects the tacho signal (TACH), and
   at least one regulating circuit according to claim 1 having a pulse-width control device comprising the control register, the measuring device being connected to the second connection (TACH) and the pulse-width control device being electrically connected to the first connection.

10. The data processing device according to claim 9, wherein, by at least one temperature sensor and an evaluator, the evaluator providing the desired value ($T_{soll}$) for the regulating circuit on the basis of a temperature detected by the temperature sensor.

11. A method of regulating rotary speed of a pulse-width-modulated fan comprising:
   determining a period duration ($T_{Ist}$) of a tacho signal (TACH) of the fan,
   updating a regulation value (R) that drives the fan on a basis of the determined period duration ($T_{Ist}$) and a desired value ($T_{soll}$), the regulation value (R) comprising a highest level bit and a lowest level bit, and at least the lowest level bit being updated during each update, and
   determining a duty ratio to drive the fan on the basis of the highest level bit of the determined regulation value (R),
   wherein updating the regulation value (R) comprises:
      detecting a digital actual value on a basis of the determined period duration($T_{Ist}$),
      determining a difference ($\Delta T$) between the digital actual value and the desired value ($T_{soll}$) predefined as a digital value, and
      correcting the regulation value (R) given as a digital value with the correct sign by the determined difference ($\Delta T$), and
      determining the duty ratio comprises storing a predetermined number of highest level bits of the digital regulation value (R) as a digital control value (P) for a pulse width device.

12. The method of claim 11, wherein updating the regulation value is performed for each determined period duration.

13. A non-transitory computer readable medium containing program code having processor instructions for a microcontroller carrying out the method according to claim 11 during execution of the processor instructions by the microcontroller.

14. The method according to claim 11, wherein determining the period duration($T_{Ist}$), updating the regulation value (R) and determining the duty ratio are carried out at least once per revolution of a fan wheel of the fan and/or once per tacho pulse of the tacho signal.

* * * * *